United States Patent [19]
Dorfman et al.

[11] Patent Number: 5,468,457
[45] Date of Patent: Nov. 21, 1995

[54] METHOD OF MAKING TUNGSTEN-COPPER COMPOSITE OXIDES

[75] Inventors: Leonid P. Dorfman, Athens; Michael J. Scheithauer, Ulster; David L. Houck, Towanda; Nelson E. Kopatz, Sayre, all of Pa.

[73] Assignee: Osram Sylvania Inc., Danvers, Mass.

[21] Appl. No.: 362,024

[22] Filed: Dec. 22, 1994

[51] Int. Cl.$^6$ .............................. C01G 41/00; C01G 3/00
[52] U.S. Cl. .............................................. 423/61; 423/593
[58] Field of Search ....................................... 423/61, 593

[56] References Cited

PUBLICATIONS

V. V. Skorokhod et al., Reaction in the Cu–W–O System, Journal of Inorganic Materials of the Russian Academy of Sciences, vol. 20, No. 3, pp. 458–460 (1984), Mar.

A. K. Basu, F. R. Sale, Copper–tungsten Composite Powders by the Hydrogen Reduction of Copper Tungstate, Journal of Materials Science, 13 (1978) pp. 2703–2711, no month.

Q. Chongliang et al., A Study on Fine Grain W–Cu Electrode Material with High Homogeneity, Proceedings of the 13th International Plansee Seminar, Metallwerk Plansee, vol. 1, pp. 461–470 (1993), no month.

V. V. Skorokhod et al., Theory and Technology of Sintering, Thermal, and Chemicothermal Treatment Processes, Poroshkovaya Metallurgiya, No. 9 (249), pp. 9–13 (1983), Sep.

*Primary Examiner*—Steven Bos
*Attorney, Agent, or Firm*—Robert F. Clark

[57] ABSTRACT

A method of making a tungsten-copper composite oxide wherein an amount of an oxide of tungsten and an amount of an oxide of copper are combined to form a mixture, the oxide of tungsten or the oxide of copper, or both, being in a hydrated form. The mixture is then milled, dehydrated and fired at a temperature and for a time sufficient to form the tungsten-copper composite oxide, the time sufficient to form the tungsten-copper composite oxide being at least about one-half the time sufficient to form the tungsten-copper composite oxide from a mixture of tungsten trioxide, $WO_3$, and cupric oxide, $CuO$, under substantially similar conditions.

12 Claims, No Drawings

METHOD OF MAKING TUNGSTEN-COPPER COMPOSITE OXIDES

CROSS REFERENCES TO RELATED APPLICATIONS

This application is related to Ser. No. 08/361,415 filed concurrently herewith, the disclosure of which is hereby incorporated by reference.

TECHNICAL FIELD

This invention relates to the manufacture of tungsten-copper pseudoalloys. More particularly, this invention relates to methods of making tungsten-copper composite oxides as precursor materials for making tungsten-copper pseudoalloys.

BACKGROUND ART

Tungsten-copper (W-Cu) pseudoalloys have been used as electrical contact materials and electrodes. The basic methods for the fabrication of W-Cu pseudoalloys include: infiltration of a porous tungsten skeleton with liquid copper, hot pressing of blends of tungsten and copper powders, and various techniques incorporating liquid phase sintering, repressing, explosive pressing, and the like. It is desirable to be able to manufacture articles made from W-Cu pseudoalloys at or near the theoretical density of the pseudoalloy. Besides having improved mechanical properties, the higher density pseudoalloys have higher thermal conductivities which are critical for the application of W-Cu pseudoalloys as heat sink materials for the electronics industry.

One method for producing high density W-Cu pseudoalloys consists of liquid-phase sintering of ultrafine W-Cu composite powders. Such composite powders may be produced, for example, by hydrogen co-reduction of tungsten and copper oxide blends. Another method is the direct reduction of copper tungstates. It has been demonstrated that the direct hydrogen reduction of copper tungstates imparts a high degree of phase dispersion and homogeneity to the W-Cu pseudoalloys resulting in superior thermomechanical properties. The reason for this is because copper tungstates provide a metallurgical environment where copper and tungsten are mixed together at an atomic level.

There are a number of W-Cu composite oxides in the Cu-W-O system including copper tungsten bronzes (nonstoichiometric W-Cu composite oxides of the form $Cu_xWO_3$, x=0.26, 0.34, and 0.77), cupric tungstate ($CuWO_4$), cuprous tungstate ($Cu_2WO_4$), and copper orthotungstate ($Cu_3WO_4$). The copper content in these composite oxides spans the 10 to 50 wt. % copper range in the W-Cu pseudoalloys of particular interest to the industry. Most of the work to this point has focused on the reduction of cupric tungstate ($CuWO_4$) to form W-Cu pseudoalloys. This is apparently because the relative copper content of cupric tungstate (i.e., relative to tungsten), 25.7 wt. %, is approximately in the middle of the technically important range. Adjustment of the relative copper content of the composite oxide in the 10–25% range can be accomplished by adding $WO_3$ to $CuWO_4$.

One technique for forming $CuWO_4$ involves the liquid precipitation of a hydrated tungstate from aqueous solutions of $CuSO_4.5H_2O$ and $Na_2WO_4$ or $H_2WO_4$ and $CuCO_3.Cu(OH)_2$. However, it has been found that the W-Cu pseudoalloy powders obtained from the reduction of precipitated tungstates are difficult to compact and thus the densities of the sintered pseudoalloys were low. Additionally, the solution-precipitation process is lengthy and the hydrometallurgical parameters are difficult to control.

Another technique involves the solid-phase synthesis of $CuWO_4$ by firing intimate mixtures of equimolar proportions of CuO and $WO_3$ (cupric tungstate may also be written as $CuO.WO_3$). The W-Cu pseudoalloy powders obtained by the reduction of cupric tungstate made by this technique exhibit a uniform distribution of phases and desirable compacting and sintering properties. However, the firing times and temperatures required to produce W-Cu composite oxides from CuO and $WO_3$ lessen the economics of producing W-Cu composite oxides from such a technique. Thus, it would be desirable to have a more economical method of producing W-Cu composite oxide powders having similar characteristics.

SUMMARY OF THE INVENTION

It is an object of this invention to provide an economical method for producing W-Cu composite oxide powders.

It is a further object of this invention to provide a method for producing a W-Cu composite oxide which when reduced produces a W-Cu pseudoalloy powder having a uniform distribution of phases.

It is still a further object of this invention to provide a method for producing a W-Cu composite oxide in a static bed without mixing of the reactants during firing.

In accordance with one aspect of the invention, there is provided a method of making a tungsten-copper composite oxide, comprising the steps of combining an amount of an oxide of tungsten and an amount of an oxide of copper to form a mixture, the oxide of tungsten or the oxide of copper, or both, being in a hydrated form, milling the mixture, dehydrating the mixture and firing the mixture at a temperature and for a time sufficient to form the tungsten-copper composite oxide, the time sufficient to form the tungsten-copper composite oxide being at least about one-half the time sufficient to form the tungsten-copper composite oxide from a mixture of tungsten trioxide, $WO_3$, and cupric oxide, CuO, under substantially similar conditions.

In accordance with another aspect of the invention, there is provided a method of making a tungsten-copper composite oxide, comprising the steps of combining an amount of an oxide of tungsten and an amount of an oxide of copper to form a mixture, the oxide of tungsten or the oxide of copper, or both, being in a hydrated form and having a dehydration temperature;

milling the mixture, forming a bed of the mixture in a furnace having a temperature below the temperature needed to dehydrate the hydrated oxide(s);

increasing the temperature of the furnace to a temperature sufficient to form the tungsten-copper composite oxide, the temperature of the furnace being increased at a rate sufficient to allow the mixture to become dehydrated prior to the formation of the tungsten-copper composite; and firing the mixture at the temperature sufficient to form the tungsten-copper composite oxide and for a time sufficient to form the tungsten-copper composite oxide powder, the time sufficient to form the tungsten-copper composite oxide being at least about one-half the time sufficient to form the tungsten-copper composite oxide from a mixture of tungsten trioxide, $WO_3$, and cupric oxide, CuO, under substantially similar conditions.

DESCRIPTION OF THE PREFERRED EMBODIMENTS

For a better understanding of the present invention, together with other and further objects, advantages and capabilities thereof, reference is made to the following disclosure and appended claims.

We have found that W-Cu composite oxides can be made at substantially lower firing times and temperatures than those required to produce W-Cu composite oxide from mixtures of CuO and $WO_3$. These time and temperature reductions are achieved by replacing either CuO or $WO_3$, or both, with a hydrated form of the corresponding oxide. In particular, tungstic acid, $H_2WO_4$, which can be written as $WO_3 \cdot H_2O$, may be used in place of $WO_3$ and cupric hydroxide, $Cu(OH)_2$, which can be written as $CuO \cdot H_2O$, may be used in place of CuO. Both $H_2WO_4$ and $Cu(OH)_2$ are thermodynamically stable at ambient temperature. However, at temperatures above 300° C., they decompose losing water to form $WO_3$ and CuO. The thermal decomposition of the hydrated oxides changes the morphology of the dehydrated oxides. Dehydration increases the surface area of the hydrated powders and, correspondingly, their surface reactivity. Thus, it is believed that favorable kinetic conditions are created for the solid-state synthesis process by lowering the activation energy of the chemical reaction and increasing the diffusion mobility of the solid reactants. This is believed to lead to the very high chemical reactivity of the freshly dehydrated mixture which results in the lower reaction temperatures and shorter firing times needed to bring the reaction to completion.

Although forming an intimate mixture of the reactants is important, hard-metal ball milling or wet milling of the oxide mixture is not necessary prior to dehydration and firing. In order to reduce contamination of the mixture, the milling needed to produce the intimate mixture can be carried out in a clean environment using a ceramic mill and ceramic ball milling media.

The conversion of the reactants to the composite oxide is carried out in air. The intimate mixtures are charged into trays made of a refractory material, such as fused silica, at or about room temperature and are slowly heated in a furnace to the reaction, or firing, temperature. A continuous belt furnace having thermal zones for providing the proper temperature gradient is preferred.

The slow heating of the mixture is needed to dehydrate the hydrated forms of the oxides at a rate which does not result in the rapid evolution of water vapor. If the dehydration occurs too rapidly, the static bed of reactants becomes disturbed which increases the interparticle distances and impedes the solid-state synthesis. We have found that the rate at which the mixtures are heated is inversely proportional to the bed depth of the mixture in the tray. It has been determined that for bed depths in the range of about 0.25 to about 1.0 inches the heating rate should be from about 5° C. to about 1° C. per minute. A bed depth of about 0.5 to about 0.75 inches and a heating rate of about 3° C. to about 2° C. per minute is preferred.

Once the firing temperature is reached, the furnace temperature is held constant until the reaction is complete and the composite oxide is formed. When only one hydrated component is used, the conversion of the composite oxide can be achieved by firing the dehydrated mixture for about 1 hour at about 800° C. When two hydrated components are used, the composite oxide can be formed by firing the dehydrated mixture at about 600° C. for about 1 hour. The lower temperature allows the use of Inconel boats rather than fused silica (quartz) trays, although the latter are still preferred. After firing, the trays are moved into a cooler zone in the furnace and allowed to cool for about ½ hour. The conversion of the reactants to the W-Cu composite oxide can be confirmed by x-ray diffraction techniques.

The following non-limiting examples are presented.

EXAMPLE 1

Cupric tungstate, $CuWO_4$, was made using hydrated forms of the $WO_3$ and CuO. A mixture of reactants was formed by crushing ¼" round pellets of tungstic acid, $H_2WO_4$, in a mortar, screening the crushed material with a −100 mesh screen and combining 499.7 g of the crushed and screened tungstic acid with 195.12 g of −325 mesh cupric hydroxide, $Cu(OH)_2$. The amounts of the two powders were selected to yield an equimolar ratio of $WO_3$ and CuO after dehydration. The mixture was milled for 1 hour in a ceramic mill using a 1.5 to 1 ratio of milling media (ceramic balls) to mixture. The solid phase synthesis of $CuWO_4$ from the hydrated mixture was carried out in a laboratory tube furnace in an air atmosphere. The hydrated mixture was placed in rectangular quartz trays in 100 to 200 g quantities which yielded bed depths of between ½ to ¾ inches. The temperature of the furnace was increased from room temperature at a rate of about 2°–3° C. per minute until the firing temperature was reached. Full conversion to $CuWO_4$ was achieved in 1 hour at 600° C. The trays were then moved out of the hot zone of the furnace and allowed to cool for about 30 minutes. Conversion of the reactants to $CuWO_4$ was determined by x-ray diffraction.

EXAMPLE 2

Cupric tungstate was prepared in a manner similar to Example 1, except that only the hydrated form of CuO, cupric hydroxide, was used. In this example, 463.7 g of tungsten trioxide, $WO_3$, having a Fisher Sub-Sieve Sizer (FSSS) particle size of 18.4 µm was combined with 195.08 g of −325 mesh cupric hydroxide. The reactants were blended and milled in the manner described in Example 1 to form an intimate mixture. Inconel boats were charged with 100 to 200 g of the mixture to form beds having depths of ½ to ¾ inches. The mixture was heated at a rate of 2° 3° C. per minute until the firing temperature was reached. Full conversion to $CuWO_4$ was achieved in 1 hour at 800° C. and then cooled. A reduction of the synthesis duration to 30 minutes at 800° C. yielded a 98% conversion to $CuWO_4$.

EXAMPLE 3

Cupric tungstate was formed in a manner similar to Example 1. Using the tungsten trioxide, $WO_3$, used in Example 2, and −325 mesh cupric oxide, CuO. A stoichiometric ratio of the reactants was used. The reactants were blended and milled as described in Example 1. Charges of 100 g were placed in trays forming bed depths not exceeding ½ inch. The trays were then fired for various times and temperatures, cooled, and then removed from the furnace. The fired mixtures were then measured to determine the percentage of $CuWO_4$ formed.

Table 1 lists the percentage conversion to $CuWO_4$ at different firing temperatures for the reactions in Examples 1–3. The firing time for each temperature given in table 1 was 1 hour, except for 800° C. which has a second column for a 2 hour firing time.

TABLE 1

| | | Percentage Conversion to $CuWO_4$ vs. Firing Temperature (°C.) | | | | | | |
|---|---|---|---|---|---|---|---|---|
| Example | Reaction | 300 1 h. | 400 1 h. | 500 1 h. | 600 1 h. | 700 1 h. | 800 1 h. | 800 2 h. |
| 1 | $H_2WO_4 + Cu(OH)_2 \rightarrow CuWO_4 + 2H_2O$ | 0 | 6 | 79 | 100 | — | — | — |
| 2 | $WO_3 + Cu(OH)_2 \rightarrow CuWO_4 + H_2O$ | — | — | — | 45 | 75 | 100 | — |
| 3 | $WO_3 + CuO \rightarrow CuWO_4$ | — | — | — | 27 | 63 | 88 | 96 |

The results in table 1 show that when both reactants are in hydrated form (Example 1) the complete conversion to cupric tungstate can be accomplished by firing the mixture at about 600° C. for about 1 hour. The results further demonstrate that by using one hydrated component (Example 2) full conversion can be accomplished by firing at about 800° C. for about 1 hour. Both of these reactions occur in about ½ the time needed to obtain at least 96% conversion for the reaction using $WO_3$ and CuO as the reactants (Example 3). Thus, by using at least one hydrated oxide, the reaction times and temperatures needed to form the W-Cu composite oxides can be significantly reduced which should result in a more economical means of producing the desired W-Cu composite oxides.

While there has been shown and described what are at the present considered the preferred embodiments of the invention, it will be obvious to those skilled in the art that various changes and modifications may be made therein without departing from the scope of the invention as defined by the appended claims.

We claim:

1. A method of making a tungsten-copper composite oxide, comprising the steps of combining an amount of an oxide of tungsten and an amount of an oxide of copper to form a mixture, the oxide of tungsten or the oxide of copper, or both, being in a hydrated form, milling the mixture, dehydrating the mixture and firing the mixture at a temperature and for a time sufficient to form the tungsten-copper composite oxide.

2. The method of claim 1 wherein the mixture is fired in air.

3. The method of claim 1 wherein the oxide of tungsten is tungsten trioxide and the oxide of copper is cuprous oxide or cupric oxide.

4. The method of claim 1 wherein the oxide of tungsten in hydrated form is tungstic acid, $H_2WO_4$, and the oxide of copper in hydrated form is cupric hydroxide, $Cu(OH)_2$.

5. The method of claim 1 wherein the mixture is fired at between about 600° C. to about 800° C. for about 1 hour.

6. A method of making a tungsten-copper composite oxide, comprising the steps of:

combining an amount of an oxide of tungsten and an amount of an oxide of copper to form a mixture, the oxide of tungsten or the oxide of copper, or both, being in a hydrated form and having a dehydration temperature;

milling the mixture, forming a bed of the mixture in a furnace having a temperature below the temperature needed to dehydrate the hydrated oxide(s);

increasing the temperature of the furnace to a temperature sufficient to form the tungsten-copper composite oxide, the temperature of the furnace being increased at a rate sufficient to allow the mixture to become dehydrated prior to the formation of the tungsten-copper composite; and firing the mixture at the temperature sufficient to form the tungsten-copper composite oxide and for a time sufficient to form the tungsten-copper composite oxide.

7. The method of claim 6 wherein the mixture is fired in air.

8. The method of claim 6 wherein the oxide of tungsten is tungsten trioxide and the oxide of copper is cuprous oxide or cupric oxide.

9. The method of claim 6 wherein the oxide of tungsten in hydrated form is tungstic acid, $H_2WO_4$, and the oxide of copper in hydrated form is cupric hydroxide, $Cu(OH)_2$.

10. The method of claim 6 wherein the mixture is fired at between about 600° C. to about 800° C. for about 1 hour.

11. The method of claim 6 wherein the bed has a bed depth between about 0.25 inches to about 1.0 inches and the rate of temperature increase is between about 5° C. to about 1° C. per minute.

12. The method of claim 11 wherein the bed depth is between about 0.5 inches to between about 0.75 inches and the rate of temperature increase is between about 3° C. to about 2° C. per minute.

* * * * *